Sept. 23, 1969 E. E. METZGER 3,468,328

DISTRIBUTED AMPLIFIER

Filed Oct. 15, 1965

INVENTOR
ERIC E. METZGER

BY Hurwitz & Rose

ATTORNEYS

United States Patent Office 3,468,328

Patented Sept. 23, 1969

3,468,328

DISTRIBUTED AMPLIFIER

Eric E. Metzger, Silver Spring, Md., assignor to Bowles Engineering Corp., Silver Spring, Md., a corporation of Maryland Filed Oct. 15, 1965, Ser. No. 496,401
Int. Cl. F15c *1/08;* G06m *1/12*
U.S. Cl. 137—81.5 19 Claims

ABSTRACT OF THE DISCLOSURE

In a distributed fluidic amplifier circuit, a plurality of spatially distributed fluidic amplifier elements are connected in parallel by fluid transmission lines. The interstage time delays between application of an input signal to each element equal the corresponding interstage time delays required to combine the output signals from each element. The output signals from each element are thus co-phasal and additive. In one embodiment, a single input signal transmission line is connected to an input port of each element, and a single output signal transmission line is connected to an output port of each element, the signal delay time between successive elements along the input transmission line being equal to the signal delay time between the same successive elements along the output transmission line.

The present invention relates generally to pure fluid distributed amplifiers, and more particularly to pure fluid amplifiers which are spatially distributed but which provide co-phasal outputs to a common load.

The present invention pertains both to acoustic amplifiers and to pulse or DC amplifiers. The term acoustic amplifier applies to amplifiers which are capable of responding to mechanical waves in a fluid medium, such as sonic or ultrasonic waves. The term pulse amplifier relates to amplifiers capable of providing a high level pressure pulse in response to a low level pressure pulse. The term DC amplifier refers to an amplifier capable of modifying a steady or slowly varying fluid flow in response to a corresponding fluid control signal. The problem involved in paralleling fluid amplifiers relates in part to the fact that fluid amplifiers occupy space, and that fluid or acoustic waves in fluid require time to traverse this space, leading to failure of the plural amplifier inputs to add, or to retain waveforms in adding relationship unless account is taken of inherent differential delays incurred in signal supply and load lines.

The use of the distributed amplifier configuration is known in electrical amplifiers. It is known that such amplifiers are capable of high gain, when handling high frequency signals, and that noise figure is low. In accordance with the present invention, the concept involved in electrical distributed amplifiers is utilized in pure fluid amplifiers.

It is, accordingly, an object of the invention to provide a novel pure fluid amplifier, specifically of the distributed type.

The above and still further objects, features and advantages of the present invention will become apparent upon consideration of the following detailed description of one specific embodiment thereof, especially when taken in conjunction with the accompanying drawing, wherein.

Figure 1:
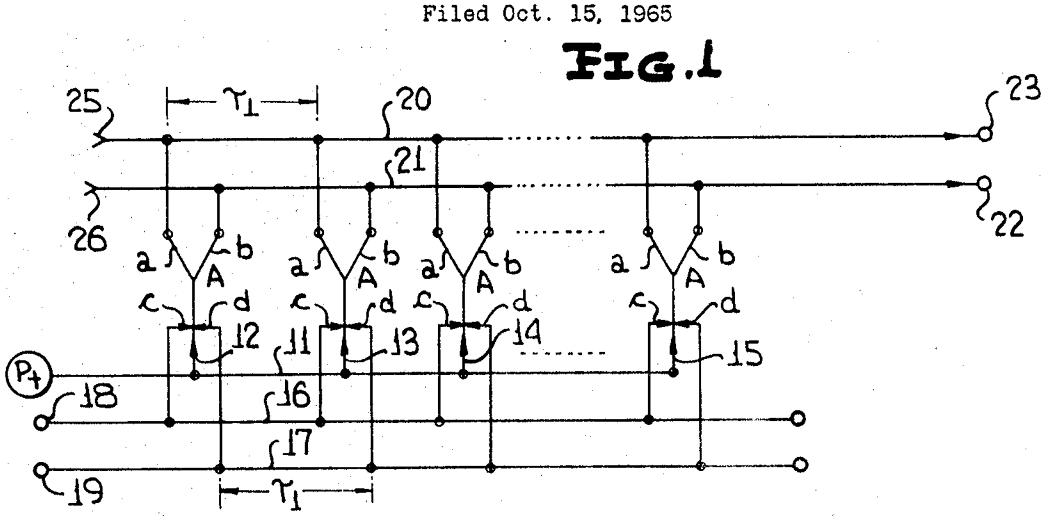
FIGURE 1 is a schematic circuit diagram of a pure fluid amplifier, according to the invention.

Referring now to FIGURE 1, the port 10 provides fluid under pressure on a continuous basis. The fluid from port 10 flows via duct 11 concurrently to plural port nozzles 12, 13, 14, 15, in parallel providing a continuous flow of power jets therefrom. These jets travel to pairs of divider collection channels, a pair for each jet, identified by the subscripts *a*, *b*. The main jet can be divided selectively on an analog or bistable basis, as desired, to the collector channels, *a*, *b*, according to fluid control signals provided at control nozzles *c*, *d*, from two signal control lines 16, 17, succeeding points along 16 being connected to successive control nozzles *c*, and succeeding points along line 17 being connected to successive nozzles *d*. The lines 16, 17 are fluid transmission lines, so that any acoustic signal applied to their inputs 18, 19 travels along the line with a predetermined phase delay per unit length equal to $\tau$ for the distance between adjacent control nozzles *c* or *d*. The collector channels *a*, *b* terminate in transmission lines 20, 21, respectively, which provide the same phase velocities as do the lines 16, 17.

Delays may be of two distinct types. If the input signal at inputs 18, 19 are continuous wave signals, the delay is a phase delay. If discrete pulses are applied, the important delay is a group delay. Since delays of each type are determined as a function of plural fluid flow characteristics, provision (not illustrated) may be made for adjusting effective line lengths along the control lines 16, 17 or the signal input lines 20, 21, or both.

A signal applied to input 18, travels along line 16 with delays $\tau$, as seen from successive control nozzles *c*. The resultant signals generated in line 21 travel along that line with delays $\tau$ between ports *b*. It follows that if acoustic signals are inserted at input 18, successive versions of that signal, emanating from successive ports *b*, will be cophased and will add at the output port 22. The same argument applies to line 20 and port 23. The outputs from the two ports will be counterphasal with respect to each other, if alternating acoustic signal is applied out of phase to nozzles *c*, *d*, which generates acoustic waves in channels *a*, *b*.

Insofar as concerns noise, the total output from the separate amplifier stages add statistically and therefore noise does not add in direct proportions to the number of stages, so that intense acoustic signals can be provided, having a gain $\omega$A, where A is gain per stage and $\omega$ the number of stages, but where noise output is less than $\omega$A times input noise. Signal to noise ratio is thus improved.

Acoustic signals induced in lines 20, 21, if induced by a simple connection to the line, travel in both directions along the line. Since reflections from the end of the lines will produce ghost responses, the left end of the line is coupled to atmosphere by impedance matching nozzles 25, 26, and care is taken to match impedances output terminals 22, 23 in like fashion.

In the event a pulse is applied, say to terminal 18, that pulse travels along line 16 and because of its group delay characteristic induces successive pulses on line 21. The latter pulses superpose, if delays match as between lines 16, 21, and produce an output pulse as wide as the input pulse but of mass flow $\omega$A times as great as that from a single amplifier.

The system of FIGURE 1 as illustrated is highly schematized as to presentation. However, the length of ducts from line 18 to a control nozzle 12*c*, and from nozzle 12 to line 21, has not been take account of. The total delay time $T+\alpha$, where $\alpha$ is the delay between input and output of a single amplifier stage, need not be compensated for if lines 20, 21 of the amplifier are all identical since the delay time is the same for each stage, and therefore provides merely a delay $\alpha$ as between input and output, but does not produce incoherent combination of signal in lines 20, 21. It is, however, essential that external delay $\alpha$, per stage, be the same for each stage.

Figure 2:
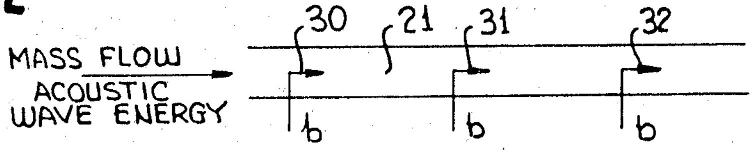
FIGURE 2 is a fragmentary schematic diagram of a system for coupling mass flow or wave energy to a long transmission line unidirectionally.

In the system of FIGURE 1, the fact that lines 20, 21 are terminated at 25, 26, by matching impedances, represents a loss of efficiency. In FIGURE 2 it is indicated that fluid or wave energy may be introduced into lines 20, 21 via directional transducers 30, 31, 32 which feed wave energy or mass flow in the direction of the load only. Thereby, the efficiency of the system can be increased by nearly 50%.

Figure 3:
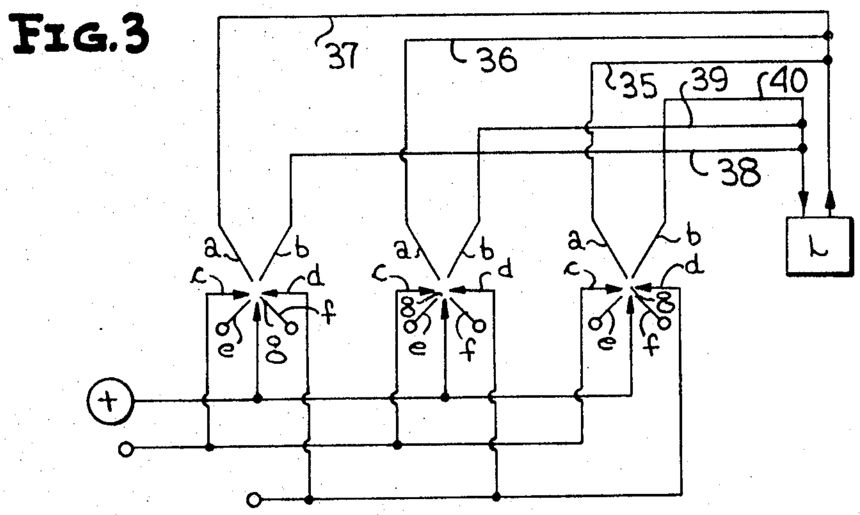
FIGURE 3 is a schematic block diagram of a modification of the system of FIGURE 1.

In FIGURE 3, is illustrated a system corresponding broadly to that of FIGURE 1, but having independent lines 35, 36, 37 proceeding from the several channels *b*, and terminating in one side of a common load L, while similar independent lines 38, 39, 40 proceed from the *a* channels and terminate in common at the other side of load L. The lengths of the lines 35–40, inclusive, are such that outputs from the amplifier stages add co-phasally at the load.

The advantage of the system of FIGURE 3 over that of FIGURE 1 is that interaction among the several stages is minimized, by eliminating static back pressure build up at the output channels, *a* or *b*, deriving from preceding amplifiers in the chain, and also in reducing discontinuities, represented by tap-in points to the lines 20, 21 from the amplifier stages, which may cause reflections. Further, the design of each load line can be optimized. For example, in the system of FIGURE 1, mass flow in either line 20 or 21 is not constant, but each tap point deriving from a channel *a* or *b* dumps additional fluid into the line. This gives rise to velocity and pressure differences at different points in the line, which in turn modifies $\tau$, in proceeding along the line. In the system of FIGURE 3 each load supply line carries only fluid deriving from one amplifier, and therefore all fluid velocities are uniform in any line, and the system becomes symmetrical and is easy to design.

If desired, separate lines may be utilized to supply control nozzles in the system of FIGURE 3, for an analogous reason to that given for the load lines. In the system of FIGURE 1, fluid is bled from the control lines 16, 17 at each succeeding amplifier, so that pressure, mass flow and velocity drop progressively. This difficulty is avoided by using independent and separate control fluid supply lines for the separate stages.

In the system of FIGURE 3, the load L is assumed to be one which requires flow-through of fluid; for example, it may be a piston driven rotary fluid motor. In such case, either lines 38, 39, 40 may be supply lines and 35, 36, 37 bleed off lines, or vice versa, by selection of one set of the control nozzles, *c, d*. Bleed off channels *e, f*, are provided for each amplifier, which join the interaction regions *g* of the amplifiers with atmosphere. Fluid can then flow, when the power nozzle is directed to channel *b*, out of a duct, as 37, down channel *a*, to interaction region *g* and out bleed-off channel *e*. The motor load L can then be reversible, in terms of selection of control line 16 or 17 for insertion of control fluid flow.

What I claim is:

1. A distributed pure fluid amplifier, including a plurality of pure fluid amplifier stages, each of said pure fluid amplifier stages including a power nozzle for issuing a power jet and control nozzles for selectively issuing oppositely directed control fluid streams intersecting said power jet, power stream collection channels for selectively collecting said power jet as a function of the flow parameters of said fluid streams, first fluid transmission line means for supplying fluid control signals in sequence to said control nozzles, and second fluid transmission line means connected to said power stream collection channels, said first and second fluid transmission line means having equal interstage time delays.

2. The combination according to claim 1 wherein said control signals are acoustic.

3. The combination according to claim 1 wherein said control signals are pulses of mass flow.

4. The combination according to claim 1 wherein said second transmission line means is a single transmission line, said second fluid transmission line channel being connected to separated points along said single transmission line.

5. The combination according to claim 1 wherein said second transmission line means includes a separate transmission line coupling each of said pure fluid amplifier stages to a common load.

6. A distributed fluidic amplifier circuit comprising:

a circuit input port;

a circuit output port;

a plurality of spatially distributed fluidic amplifier stages, each stage including: a power nozzle responsive to application of pressurized fluid thereto for issuing a power stream of fluid; at least one control nozzle responsve to application of pressurized fluid thereto for issuing a control stream in interacting relationship with said power stream to deflect said power stream in accordance with the pressure of fluid applied to said control nozzle; and at least one output passage for receiving said power stream as a function of power stream deflection;

first fluid transmission line means interconnecting said input port and said one control nozzle of all said stages and responsive to an input signal applied to said input port for sequentially applying the input signal to successive ones of said stages;

second fluid transmission line means interconnecting said output port and said one output passage of all said stages for providing an output signal from said distributed fluidic amplifiers circuit;

wherein the difference in signal delay time through said first transmission line means between the control nozzle of any stage and the control nozzle of any other stage is equal to the difference in signal delay time along said second transmission line means between the output passage of said any stage and the output passage of said any other stage.

7. The circuit according to claim 6 wherein the time delay between application of an input signal to said control nozzle and appearance of a concomitant change in power stream reception at said output passage is equal for all said stages.

8. The circuit according to claim 7 wherein said control signals are acoustic.

9. The circuit according to claim 7 wherein said control signals are pulses of mass fluid flow.

10. The circuit according to claim 7 wherein said second fluid transmission line means comprises individual transmission line means comprises individual transmisson lne coupling said one output passage of each stage to said circuit output port.

11. The circuit according to claim 7 further comprising: a second control nozzle and a second output passage for each of stages; a further circuit input port; a further circuit output port; third fluid transmission line means interconnecting said further circuit input port and said second control nozzle of all of said stages and responsive to an input signal applied to said further circuit input port for sequentially applying said input signal to successive ones of said stages; and fourth fluid transmission line means interconnecting said further circuit output port and said second output passage of all said stages for providing a further output signal from said distributed fluidic amplifier circuit.

12. The fluidic circuit according to claim 11 wherein said second fluid transmission line mean comprises plural individual transmission lines coupling each of said one output passage of each stage to said circuit output port; and wherein said fourth fluid transmission line means comprises plural individual transmission lines coupling each of said second of said output passages of each stage to said further circuit output port.

13. The circuit according to claim 11 wherein said first fluid transmission line means comprises a single fluid transmission line having separated points thereon connected to respective ones of said one control nozzle of each amplifier stage; wherein said second fluid transmission line means comprises a single fluid transmission line having separated points thereon connected to respective ones of said one output passage of each amplifier stage; wherein said third fluid transmision line means comprises a single fluid transmission line having separated points thereon connected to respective ones of said second control nozzles of each amplifier stage; and wherein said fourth fluid transmission line means comprises a single fluid transmission line having separated points thereon connected to respective ones of said second output passage of each amplifier stage.

14. The circuit according to claim 13 wherein the extreme ends of said second and fourth fluid transmission lines and the downstream ends of said first and third fluid transmission lines are coupled to ambient environment via respective impedance matching nozzles.

15. The circuit according to claim 8 wherein said first fluid transmission line means comprises a single fluid transmission line having separated points thereon connected to respective ones of said one control nozzle of each amplifier stage; and wherein said second fluid transmission line means comprises a single fluidic transmission line having separated points thereon connected to respective ones of said output passage of each amplifier stage.

16. The circuit according to claim 15 wherein the upstream end of said first transmission line and the downstream end of said second transmission line are coupled to ambient environment via respective impedance matching nozzles.

17. A distributed fluidic amplifier circuit, comprising:
- a circuit input port;
- a circuit output port;
- a plurality of fluidic amplifier stages, each stage including a signal input port and a signal output port;
- first fluidic transmission line means interconnecting said circuit input port and the signal input port of all of said stages and responsive to an input signal applied to said circuit input port for sequentially applying said input signal to successive ones of said signal input ports;

- second fluid transmission line means interconnecting said circuit output port and the signal output port of all the said stages for providing an output signal from said distributed fluidic amplifier circuit;
- wherein the difference in signal delay time through said first transmission line means between the signal input port of any stage and the signal input port of any other stage is equal to the difference in signal delay time through said second transmission line means between the signal output port of said any stage and the signal output port of said any other stage.

18. The circuit according to claim 17 wherein said first fluid transmission line means comprises a single fluid transmission line having separated points thereon connected to respective ones of said signal input ports of said amplifier stages; and wherein said second fluid transmission line means comprises a single fluid transmission line having separated points thereon connected to respective ones of said signal output ports of said amplifier stages.

19. The circuit according to claim 18 wherein said second fluid transmission line means comprises individual transmission lines coupling each of said signal output ports of said amplifier stages with said circuit output port.

References Cited

UNITED STATES PATENTS

| | | | |
|---|---|---|---|
| 1,628,723 | 5/1927 | Hall | 137—81.5 XR |
| 3,075,548 | 1/1963 | Horton | 137—81.5 XR |
| 3,199,781 | 8/1965 | Welsh. | |
| 3,229,705 | 1/1966 | Norwood | 137—81.5 |
| 3,250,469 | 5/1966 | Colston | 137—81.5 XR |
| 3,276,689 | 10/1966 | Freeman. | |
| 3,338,515 | 8/1967 | Dexter | 137—81.5 XR |
| 3,339,570 | 9/1967 | Hatch | 137—81.5 |

OTHER REFERENCES

Fluid Logic Shift Register With Intermediate Stages, H. R. Grubb, IBM Technical Disclosure Bulletin, vol. 6, No. 1, June 1963, pp. 24, 25 (copy in Scient. Lib. and Gp. 280, 235–201 p.f.).

SAMUEL SCOTT, Primary Examiner

U.S. Cl. X.R.

235—201